(12) United States Patent
Farnworth

(10) Patent No.: US 6,787,394 B2
(45) Date of Patent: *Sep. 7, 2004

(54) METHODS OF WAFER LEVEL FABRICATION AND ASSEMBLY OF CHIP SCALE PACKAGES

(75) Inventor: Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/357,656

(22) Filed: Feb. 3, 2003

(65) Prior Publication Data

US 2003/0139021 A1 Jul. 24, 2003

Related U.S. Application Data

(63) Continuation of application No. 09/920,970, filed on Aug. 2, 2001, now Pat. No. 6,534,341, which is a continuation of application No. 09/388,033, filed on Sep. 1, 1999, now Pat. No. 6,284,573, which is a continuation of application No. 09/082,745, filed on May 21, 1998, now Pat. No. 6,008,070.

(51) Int. Cl.[7] ............................................. H01L 21/44
(52) U.S. Cl. ........................ 438/114; 438/106; 438/110
(58) Field of Search ................................. 438/114, 106, 438/110, 113, 118, 125–127, 460, 462, 464–465

(56) References Cited

U.S. PATENT DOCUMENTS

| | | |
|---|---|---|
| 3,456,334 A | 7/1969 | Baker et al. |
| 3,597,665 A | 8/1971 | Quetsch, Jr. et al. |
| 3,735,483 A | 5/1973 | Sheldon |
| 4,356,530 A | 10/1982 | Sato et al. |
| 4,749,631 A | 6/1988 | Haluska et al. |
| 4,756,977 A | 7/1988 | Haluska et al. |
| 4,769,345 A | 9/1988 | Butt et al. |
| 4,821,151 A | 4/1989 | Pryor et al. |
| 4,866,571 A | 9/1989 | Butt |
| 4,926,238 A | 5/1990 | Mukai et al. |
| 4,967,260 A | 10/1990 | Butt |
| 5,014,159 A | 5/1991 | Butt |
| 5,111,278 A | 5/1992 | Eichelberger |
| 5,128,737 A | 7/1992 | van der Have |
| 5,260,234 A | 11/1993 | Long |
| 5,323,051 A | 6/1994 | Adams et al. |
| 5,336,928 A | 8/1994 | Neugebauer et al. |
| 5,411,918 A | 5/1995 | Keible et al. |
| 5,455,455 A | 10/1995 | Badehi |
| 5,455,459 A | 10/1995 | Fillion et al. |
| 5,481,135 A | 1/1996 | Chandra et al. |
| 5,492,863 A | 2/1996 | Higgins, III |
| 5,497,033 A | 3/1996 | Fillion et al. |
| 5,547,906 A | 8/1996 | Badehi |
| 5,646,067 A | 7/1997 | Gaul |
| 5,682,065 A | 10/1997 | Farnworth et al. |
| 5,705,079 A | 1/1998 | Elledge |
| 5,747,101 A | 5/1998 | Booth et al. |
| 5,888,884 A | 3/1999 | Wojnarowski |
| 5,903,044 A | 5/1999 | Farnworth et al. |
| 6,008,070 A * | 12/1999 | Farnworth ................... 438/114 |
| 6,084,284 A | 7/2000 | Adamic, Jr. |
| 6,097,087 A | 8/2000 | Farnworth et al. |
| 6,284,573 B1 * | 9/2001 | Farnworth ................... 438/114 |
| 6,326,697 B1 | 12/2001 | Farnworth |
| 6,534,341 B2 * | 3/2003 | Farnworth ................... 438/114 |

* cited by examiner

Primary Examiner—Long Pham
Assistant Examiner—Thao X. Le
(74) Attorney, Agent, or Firm—TraskBritt

(57) ABSTRACT

A method for producing integrated circuit devices comprises the steps of forming and packaging such devices at the wafer scale, including forming a plurality of chip circuits with bond pads, adhesively fixing a plate of glass to the active surface of the wafer, slicing the wafer, applying a sealant layer to the back side of the wafer, forming contact holes through the upper glass plate, metallizing the glass plate and singulating the individual chips. Use of etchable glass for the package and palladium for metallization provides an advantageous construction method.

20 Claims, 5 Drawing Sheets

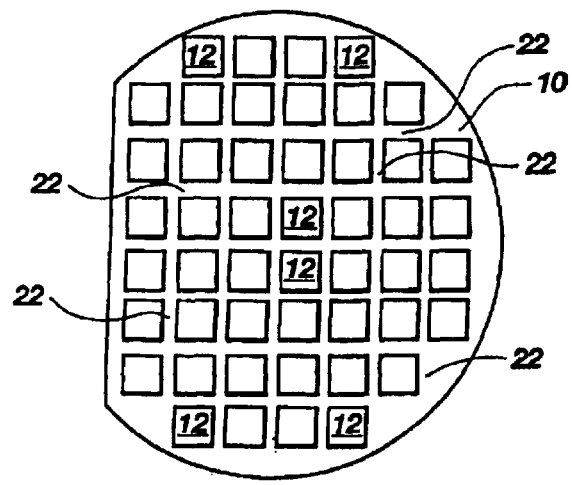
Fig. 1
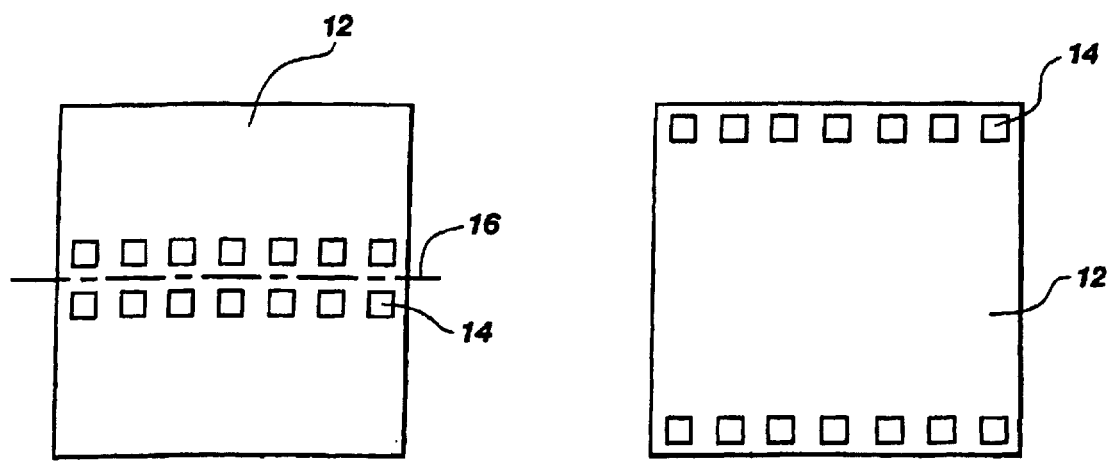
Fig. 2        Fig. 3

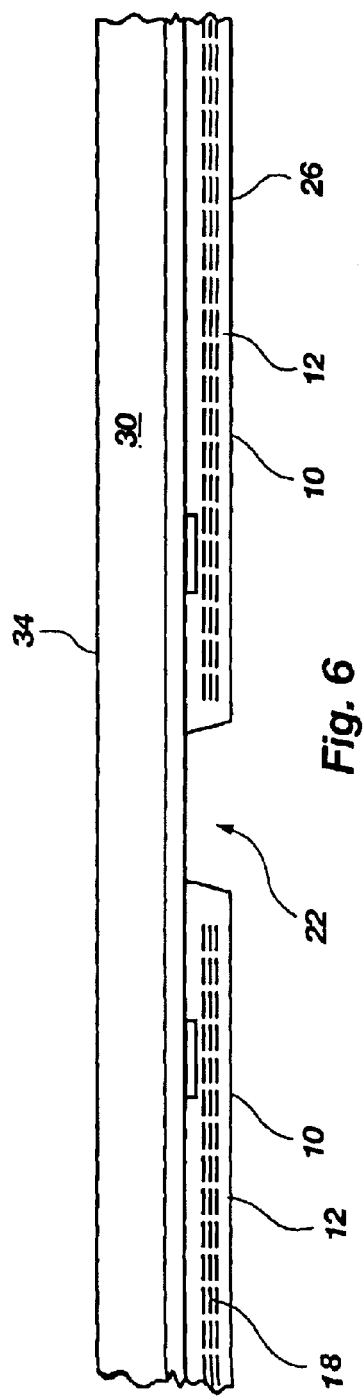
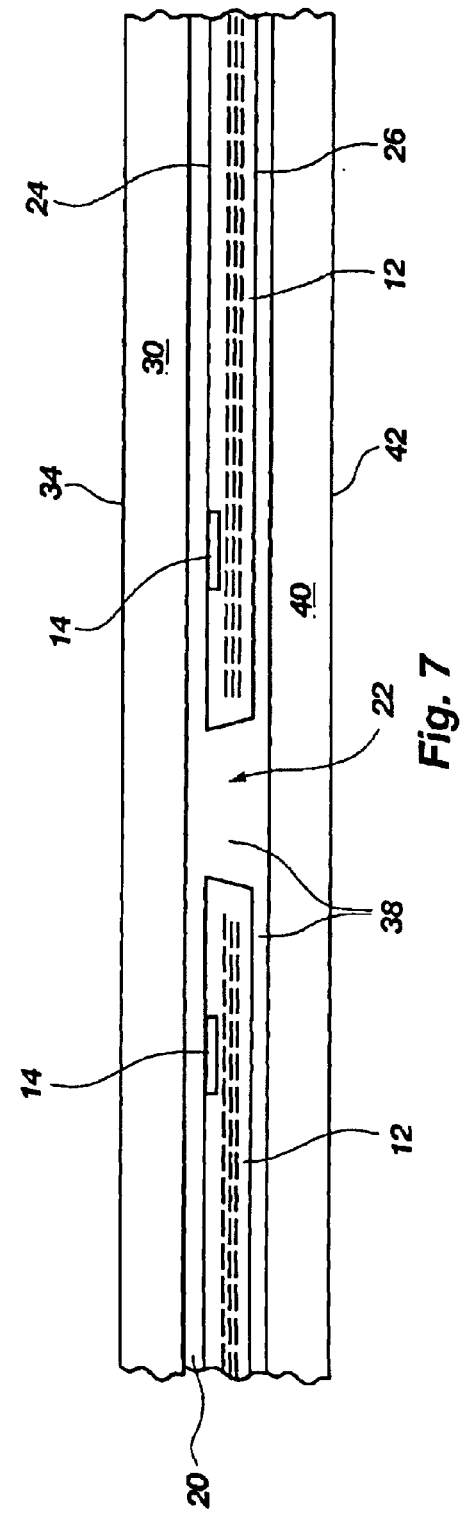

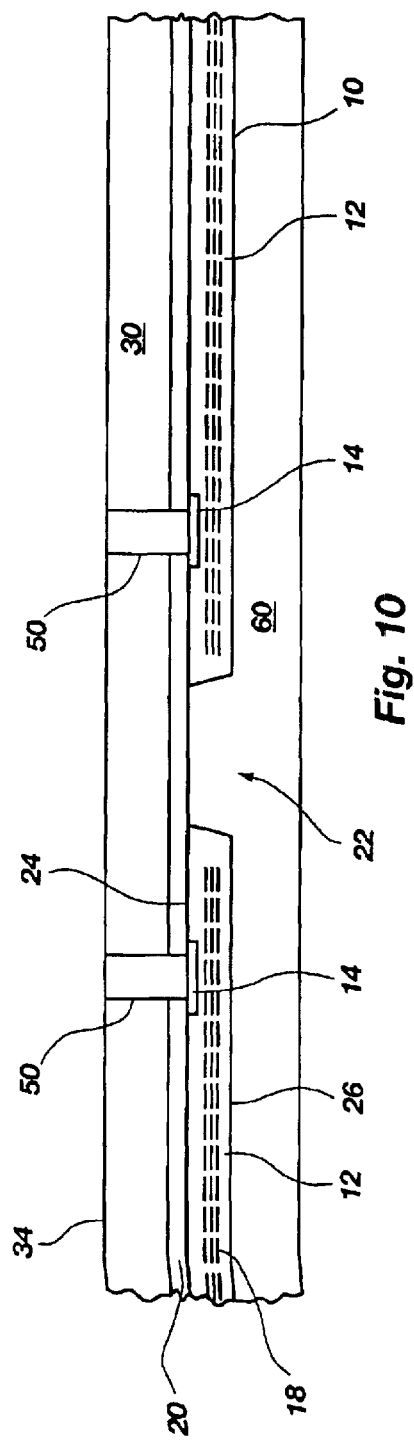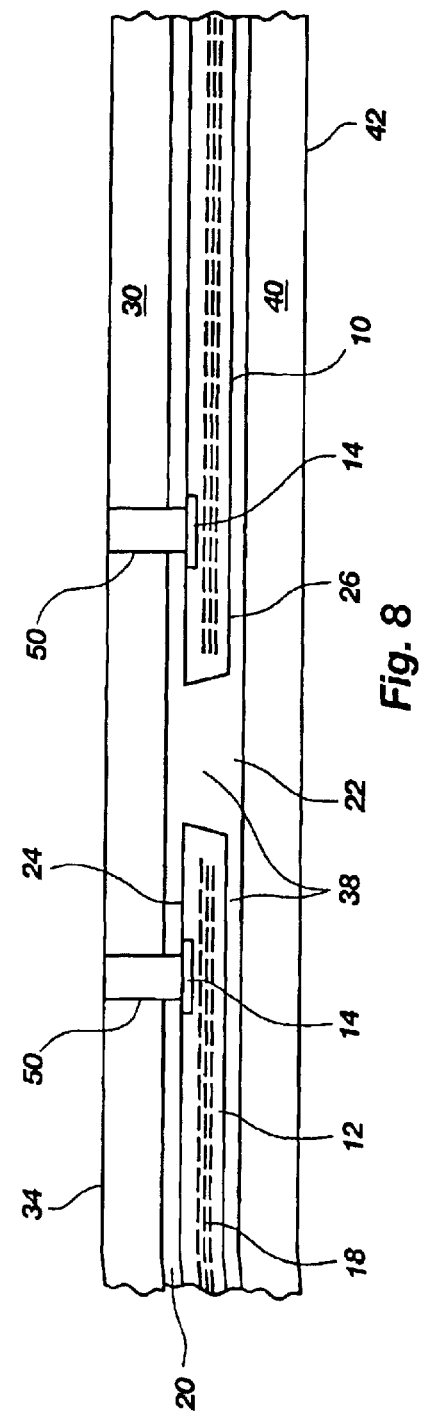

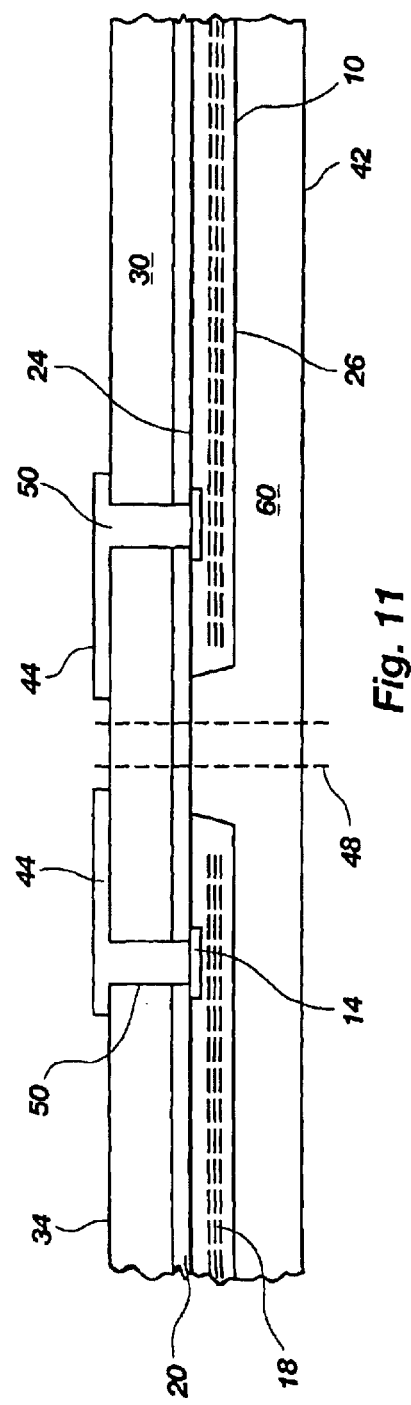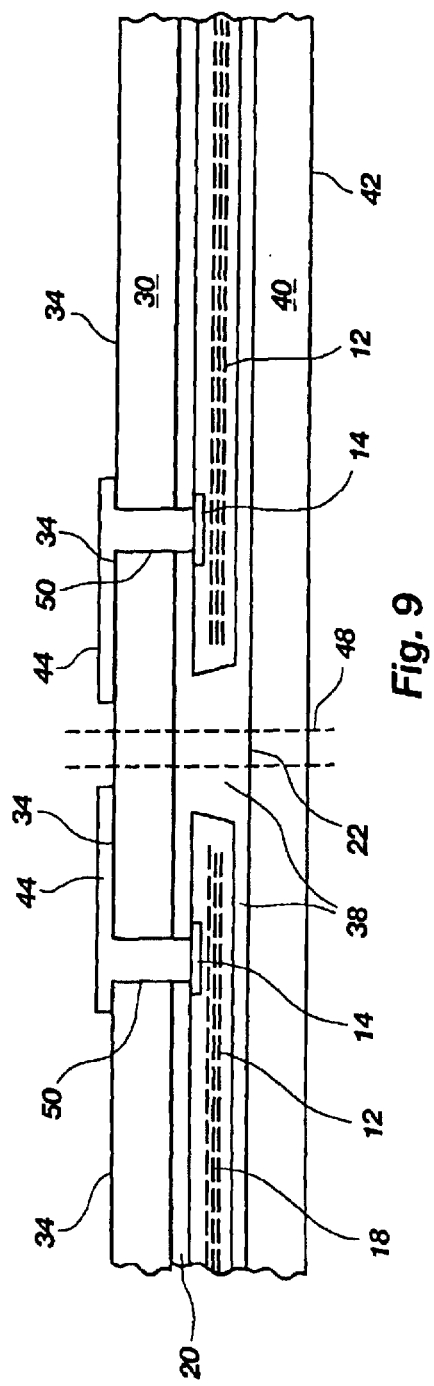

METHODS OF WAFER LEVEL FABRICATION AND ASSEMBLY OF CHIP SCALE PACKAGES

CROSS-REFERENCE TO RELATED APPLICATIONS

This application is a continuation of application Ser. No. 09/920,970, filed Aug. 2, 2001, now U.S. Pat. No. 6,534,341, issued Mar. 18, 2003, which is a continuation of application Ser. No. 09/388,033, filed Sep. 1, 1999, now U.S. Pat. No. 6,284,573, issued Sep. 4, 2001, which is a continuation of application Ser. No. 09/082,745, filed May 21, 1998, now U.S. Pat. No. 6,008,070, issued Dec. 28, 1999.

BACKGROUND OF THE INVENTION

1. Field of the Invention

This invention relates to packaged semiconductor devices and methods for manufacture thereof. More particularly, the invention pertains to ultra-thin devices having a small footprint and simplified processes for their manufacture including device packaging at the wafer scale.

2. State of the Art

Solid state electronic devices, more colloquially known as semiconductor chips or dice, are typically manufactured from a semiconductor material such as silicon, germanium or gallium/arsenide. Circuitry is formed on one surface of the device with input and output (I/O) pads formed around the periphery or centrally positioned to facilitate electrical connection with a host electrical apparatus.

A profusion of small electronic consumer products includes pagers, notebook computers, cellular telephones, digital cameras, modems, global position systems and electronic watches, to name a few. The rapidly growing consumer demand for small product size and low profile products drives the search for ways to construct smaller, thinner, more powerful semiconductor devices. The development of inexpensive, ultra-thin, compact devices is needed to enable the proliferation of large numbers of miniature electronic apparatus in the near future.

Currently, semiconductor chips are typically packaged to protect the chip from mechanical damage, external contamination and moisture. Most commonly, semiconductor chips are encapsulated, i.e., packaged within a polymeric material which sometimes provides opportunity for moisture ingress, gas diffusion, corrosion, etc. Thus, plastic encapsulated chips may be subject to performance degradation and abbreviated life.

Ceramic encapsulation provides a higher level of protection for the chip. However, the process is more complex and results in an expensive package of increased size.

Sealing of the semiconductor chip active circuitry at the wafer stage is known. In this process, a passivation coating of ceramic materials such as silica and/or silicon nitride may be applied by chemical vapor deposition (CVD). However, the subsequent etching back of the passivation coating at the bond pads of the semiconductor chip may damage the coating around the bond pads, resulting in a non-hermetic seal and permitting corrosion to deleteriously affect chip reliability and life.

U.S. Pat. No. 5,336,928 of Neugebauer et al. discloses a hermetically sealed device construction.

U.S. Pat. Nos. 5,455,459 and 5,497,033 of Fillion et al. disclose systems for enclosing and interconnecting multiple semiconductor chips.

U.S. Pat. No. 5,481,135 of Chandra et al. discloses the use of ceramic materials in hermetically sealed device packages.

U.S. Pat. No. 4,769,345 of Butt et al., U.S. Pat. Nos. 4,866,571, 4,967,260 and 5,014,159 of Butt, U.S. Pat. No. 5,323,051 of Adams et al., and U.S. Pat. No. 4,821,151 of Pryor et al. disclose the use of glass in the packaging of certain types of semiconductor devices.

U.S. Pat. Nos. 4,749,631 and 4,756,977 of Haluska et al. disclose ceramic and ceramic-like compositions which may be used for coating electronic devices.

In U.S. Pat. No. 5,682,065 of Farnworth et al., a fully hermetically sealed semiconductor chip is disclosed. The bare die is covered with a coating of glass using a spin-on-glass (SOG) process, a dip process or flow coating. The glass is applied as a mixture of small glass particles and a polymeric carrier, and subsequently heated to evaporate solvent(s) from the mixture and harden the applied material. Also disclosed are steps of thinning the wafer.

U.S. Pat. No. 5,547,906 of Badehi discloses a method for forming semiconductor chip packages with edge connections. The step of singulation with a cutting tool exposes the array of contacts. A glass may be used as covers for sandwiching the chip therebetween.

BRIEF SUMMARY OF THE INVENTION

The invention comprises a method for fabricating size-efficient semiconductor devices, including hermetically sealed devices, wherein most of the operations are conducted at the wafer scale. The method enables the simplified manufacture of ultra-thin packaged devices, having a footprint only slightly larger than the die size.

A wafer is prepared with multiple die sectors having internal circuits with conductive bond pads. A thin plate of glass is then adhesively attached to the active side of the wafer. The glass is configured for photo-etching, making repatterning of the wafer front side prior to glass overlay unnecessary. Furthermore, scribing of the wafer prior to metallization of the glass plate is unnecessary.

If needed, the exterior surface of the glass plate is leveled and made parallel to the front side (active surface) of the wafer and polished, based on the wafer's parallel back side. The leveling, paralleling and cleaning of the glass plate prepares the exterior glass surface for metallization.

The back side of the wafer is then reduced in thickness by chemical, mechanical, or chemical-mechanical means, such as are known in the art, to provide chip substrates with minimum thickness. The wafer is then cut or etched in the street areas between the chip sectors to individualize the chips, while leaving intact the upper glass plate to which the chips are individually attached. The glass plate enhances the resistance to premature breakage along the street areas or of the chips themselves.

A second glass plate is then adhesively affixed to the back side of the wafer, the adhesive filling the opened street areas between the chip sectors.

Alternatively, a polymeric sealant material may be applied over the back side of the wafer, instead of adhesively attaching the second plate of glass. In addition, another alternative is applying a mixture of glass particles and polymer, which may be applied in a spin-on-glass process.

On the upper glass plate, contact holes are formed through the glass and adhesive to access the bond pads, using a photolithographic etching process. The glass plate is then metallized and etched to define leads thereon.

Preferably, metallization of the front side of the glass plate is based on palladium or a palladium alloy, which, because of its solder wettability, eliminates the need for a solder mask limiting layer. A chemical vapor deposition (CVD) process or sputtering process deposits the conductive metal in the contact holes and on the glass surface, and a subsequent patterning of the metallization enables the formation of interconnects on the glass surface. Alternately, deposit may be made by wet deposition by first sputtering metal, such as aluminum, etc., then patterning the metal (aluminum), then using a zincate process, applying nickel, then applying a flash plating of palladium, which results in a thicker metal and a lower resistance with less palladium being required.

The chips may then be singulated by, e.g., sawing, and the die of each chip will be entirely closed.

To ensure that the chip is fully hermetically sealed, a coating of silicon nitride may be applied prior to, or following, the step of metallizing the upper glass surface.

In an alternative embodiment of the invention, glass is applied to the front side and/or back side of the wafer as spin-on-glass (SOG), which may be polished flat.

BRIEF DESCRIPTION OF THE SEVERAL VIEWS OF THE DRAWINGS

The invention is illustrated in the following figures, wherein the elements are not necessarily shown to scale but are uniformly identified throughout:

FIG. 1 is a plan view of a semiconductor wafer having a plurality of semiconductor chips formed thereon;

FIG. 2 is a plan view of a bare semiconductor chip having a bond pad arrangement applicable to the method of the invention;

FIG. 3 is a plan view of another type of semiconductor chip having a bond pad arrangement applicable to the method of the invention;

FIG. 6 is a partial cross-sectional view of a wafer of semiconductor chips illustrating additional steps of the method of the invention;

FIG. 7 is a partial cross-sectional view of a wafer of semiconductor chips illustrating still further steps of the method of the invention;

FIG. 8 is a partial cross-sectional view of a wafer of semiconductor chips illustrating added steps of the method of the invention;

FIG. 9 is a partial cross-sectional view of a wafer of semiconductor chips illustrating additional steps of the method of the invention;

FIG. 10 is a partial cross-sectional view of an alternative wafer of semiconductor chips illustrating alternative steps of the method of the invention; and FIG. 11 is a partial cross-sectional view of an alternative wafer of semiconductor chips illustrating additional alternative steps of the method of the invention.

DETAILED DESCRIPTION OF THE INVENTION

Figure 4:
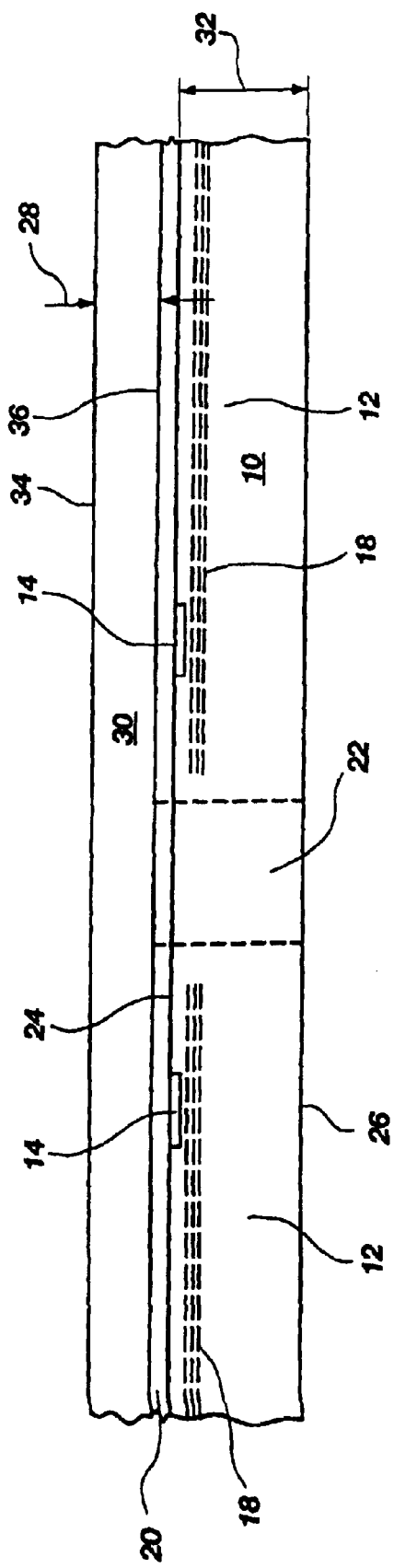
FIG. 4 is a partial cross-sectional view of a wafer of semiconductor chips illustrating initial steps of the method of the invention.

Referring to drawing FIG. 1, a wafer 10 is shown comprising a plurality of semiconductor chips or dice 12 formed thereon. Each semiconductor chip 12 may include a suitable passivation layer or layers (not shown) which is well known in the art for providing a degree of protection for the active circuitry on the chip 12. As shown, the semiconductor chips or dice 12 have not been separated but remain in the form of a wafer 10 for additional wafer processing. While in wafer form, each individual semiconductor chip 12 is distinguished from adjacent chips by generally circuit-free street areas 22 therebetween.

In the following description, the term "silicon" will be used in a generic sense to include other semiconductive materials such as gallium/arsenide or germanium, which are useful for fabricating electronic devices.

As depicted in drawing FIG. 2, a semiconductor chip 12 has a leads-over-chip configuration. Bond pads 14 are connected to circuitry within the chip 12 for access by a host electronic apparatus, not shown. The bond pads 14 are typically arrayed in one or two rows near a central axis 16 of the chip 12, as shown by representation in drawing FIG. 2, and may comprise a large number.

In drawing FIG. 3, another semiconductor chip 12 is shown with bond pads 14 positioned near opposed edges of the chip.

Chips may be formed with other bond pad configurations. The invention as described herein is applicable irrespective of the bond pad position on the chip 12.

Referring now to drawing FIGS. 4 through 11, the method of the present invention will be described with reference to a portion of a wafer 10 showing portions of several semiconductor chips 12 located thereon.

In drawing FIG. 4, shown is a portion of a silicon substrate wafer 10 which may be prepared in accordance with procedures common in the art. The substrate wafer 10 has a first side 24 and an opposed second side 26, and a thickness 32. The wafer 10 is shown with portions of two semiconductor chips 12 formed therein. Each chip 12 has an integrated circuitry 18 which is connected to bond pads 14 on the first side 24, also known as an "active surface." Passivation coatings, not shown, may be applied to portions of the first side 24, as known in the art. Street areas 22 separate the individual chips 12 on the wafer 10.

Before separating the chips 12 from the unitary wafer 10, a first thin plate 30 of glass is affixed to the first side 24 of the wafer 10 by an adhesive 20 to preferably overcover the entire wafer. The adhesive 20 may be, for example, an epoxy, polyimide, etc. Examples of such are two-part epoxies, low temperature curing polyimide-siloxanes, two-part adhesives, etc. The first glass plate 30 is preferably a photo-etchable glass having an exposed or outer surface 34 and an inner surface 36, with a thickness 28 of about 200 to about 2000 $\mu$m. An example of such a first glass plate 30 is photosensitive glass sold by SchottGlass of Yonkers, N.Y., under the trademark FOTURAN™. The photo-etchable first glass plate 30 is commercially available in thicknesses of 200 to 2000 $\mu$m.

If necessary, the exposed or outer surface 34 of the first glass plate 30 is planarized and polished, based on the second side 26, i.e., back side of the wafer 10. Use of the second side 26 as a level surface standard may be particularly required if less expensive glass plate of less stringent tolerances is used. In any event, the outer surface 34 of the first glass plate 30 must meet surface requirements for subsequent application of metallization thereto.

Figure 5:
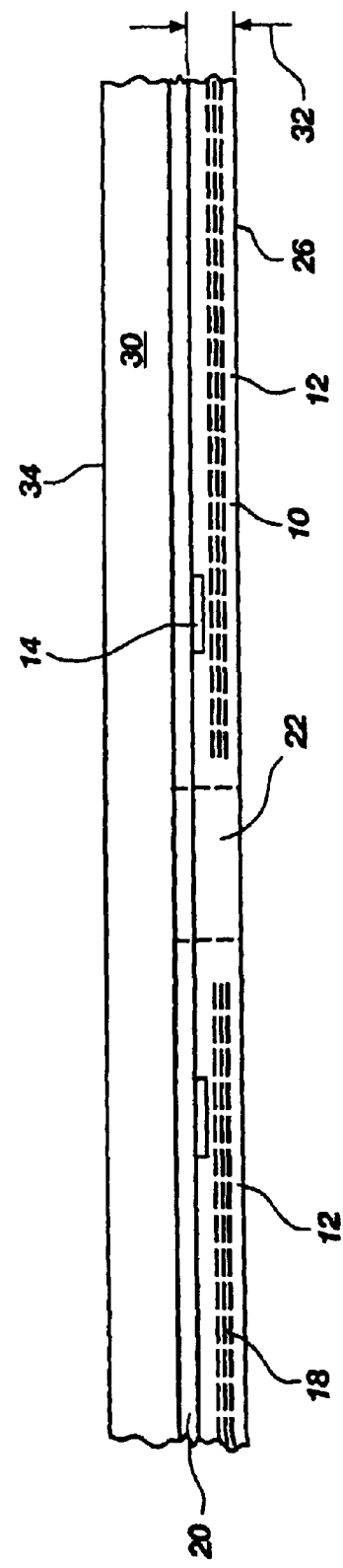
FIG. 5 is a partial cross-sectional view of a wafer of semiconductor chips illustrating further steps of the method of the invention.

Turning now to drawing FIG. 5, the wafer 10 is shown with a reduced thickness 32. The second side 26 of the wafer 10 is subjected to a thinning step which may comprise a chemical etching process, a mechanical abrasion process, or a process by which the wafer surface is wet-polished with a chemical etchant/abrasive slurry. The second side 26 is also planarized, based on the exposed outer surface 34 of the first glass plate 30. Alternatively, if no further thinning of the wafer 10 is desired, the step is omitted. Etching through of the wafer 10 in street areas 22 is more readily accomplished when the wafer is relatively thin.

As depicted in drawing FIG. 6, the chips 12 are separated by dividing the wafer 10 along the street areas 22. The street areas 22 of the wafer 10 are, for example, etched out to separate the chips 12, while each chip remains attached to the unitary first glass plate 30. Etching processes and systems which may be used to etch the semiconductor material are well known in the art, and include the application and development of resist material, not shown, for limiting the etched area. Alternatively, the street area 22 may be mechanically scribed to provide individual chips 12 on first glass plate 30. The assembly of the wafer 10 and the first glass plate 30 is then coated with a hermetic coating, such as silicon nitride, on the back side thereof.

As shown in drawing FIG. 7, a second glass plate 40 is then fixed to the second side 26 (back side) of the chips 12 by a sealant adhesive 38. The adhesive 38 fills the street area 22 removed to separate the chips 12, and is configured to be sealingly bonded to the first adhesive 20. Thus, each chip 12 is completely surrounded by a sealing adhesive. The second glass plate 40 is shown with an exterior surface 42 which generally forms one surface of the completed semiconductor device.

Turning to drawing FIG. 8, the next step of the process is illustrated as comprising the formation of linear contact holes 50 through the first (upper) glass plate 30 and adhesive 20. These holes 50 are formed by etching or by a mechanical, e.g., drilling, process. The holes 50 are aligned in an array which is identical to the array of bond pads 14 on the first side 24 of the wafer 10. The holes typically have an internal diameter of about 20 to 100 $\mu$m. An aspect ratio of about 30 to 1 is desirable for consistent filling of the contact holes with metal.

As shown in drawing FIG. 9, external leads 44 are formed by metallizing the outer surface 34 of the first glass plate 30, using a photolithographic process. While metals such as tungsten, aluminum and copper, or alloys thereof, may be deposited as leads, a preferred conductive material is palladium or an alloy thereof, because of its wettability for subsequent soldering.

The metallization includes an interconnect for each lead 44 by which connection may be made to an electrical apparatus such as a circuit board. If desired, a lead frame, not shown, may be attached to the packaged chip and wire bonded thereto. Surface mount interconnects including ball grid arrays (BGA) may be formed on the first glass for attachment to a circuit board or other substrate.

Singulation of the chips 12 results from cutting through the glass plates 30 and 40 and the adhesives 20 and 38 along paths 48 through the street areas 22.

In drawing FIGS. 10 and 11, depicted is an alternative configuration of the semiconductor package, in which the sealant layer 60 applied to the second side 26 (back side) of the wafer 10 may be (a) a glass-polymer mixture applied by spin-on-glass techniques or (b) a layer of sealant polymer. The glass-polymer is hardened by a heat treatment step which drives off solvent.

In summary, the steps of the process for making semiconductor chips are:

1. Individual integrated circuits 18 are formed in a plurality of semiconductor chips 12 on a wafer 10, each chip having electrically conductive bond pads 14 on the first side 24 of the wafer 10.

2. The chip integrated circuits 18 are optionally tested in wafer form.

3. A first glass plate 30 is fixed to the active first side 24 of a wafer 10 with adhesive 20 (or, alternatively, glass can be applied as SOG).

4. Optionally, the first glass plate 30 is polished and flattened to planarize it parallel to the second side 26 of the wafer 10.

5. The wafer 10 is thinned by grinding/etching (preferably by chemical-mechanical polishing (CMP)) to planarize the second side 26.

6. Use chemical, mechanical, or CMP process to cut through the street areas 22 of the wafer 10 and separate individual chips 12 while maintaining their attachment to the unitary first glass plate 30.

7. An insulative material is applied to the second side 26 of the wafer 10. The layer may comprise a second glass plate 40 adhesively applied to the wafer, a sealant layer 60 of spin-on-glass (SOG), or a polymeric material.

8. An array of linear contact holes 50 is formed through the first glass plate 30 to contact the bond pads 14.

9. The first glass plate 30 is metallized to fill the contact holes 50 and form interconnects on the glass outer surface 34. The metal leads 44 may comprise any of a large number of metals or alloys in use. Preferably, however, the metallization comprises palladium or a palladium alloy, whose use obviates a solder mask to limit solder reflow.

10. Optionally, a coat of silicon nitride may be applied to the device to enhance hermeticity of the package. This application may be prior to or following metallization.

11. The chips 12 are singulated by cutting through the street areas 22 surrounding each chip.

The semiconductor chips 12 may be subjected to testing at the wafer stage either prior to encapsulating with glass or following completion of the metallization step, preferably before chip singulation.

There are a number of advantages which accrue from the use of the present invention.

First, the package may be made truly hermetically sealed.

Second, use of the back side of the silicon wafer permits paralleling the first glass plate to the wafer front, thus eliminating a process step and allowing the use of an unground, inexpensive glass plate material.

Third, the surface of the first glass plate may be prepared for metallization during its planarization, eliminating a separate step.

Fourth, the use of photo-etchable glass obviates a repattern step prior to overlay of the first glass plate, resulting in lower trace resistance and parasitic losses as well as shorter traces for increased speed.

Fifth, the use of photo-etchable glass eliminates the need to scribe the wafer prior to the metallization step.

Sixth, the use of palladium metallization eliminates the need to add a solder mask limiting layer after the under bump metallization (UBM) is applied.

It is apparent to those skilled in the art that various changes and modifications may be made to the chip configurations of the invention and methods of making and practicing the invention as disclosed herein without departing from the spirit and scope of the invention as defined in the following claims.

What is claimed is:

1. A manufacturing method for a plurality of semiconductor devices comprising:

forming a semiconductor wafer substrate having a first side, having a second side, having a plurality of semiconductor devices formed on said first side of said semiconductor wafer substrate having street areas located therebetween, each semiconductor device of said plurality of semiconductor devices having at least one circuit and a plurality of bond pads, at least one bond pad of said plurality of bond pads connected to said at least one circuit;

adhesively securing a first plate of glass to said first side of said semiconductor wafer substrate, said first plate of glass having an exterior surface and having an interior surface substantially parallel to said exterior surface;

planarizing and polishing said exterior surface of said first plate of glass in correlation with said second side of said semiconductor wafer substrate;

removing a portion of said second side of said semiconductor wafer substrate to reduce a thickness thereof;

separating said plurality of semiconductor devices by removing semiconductor substrate material in said street areas, said plurality of semiconductor devices remaining affixed to said first plate of glass;

applying a sealant material to said second side of said semiconductor wafer substrate;

forming an array of contact holes extending through said first plate of glass to said plurality of bond pads;

depositing a metal on said exterior surface of said first plate of glass to form a pattern of conductive leads for connecting to said plurality of bond pads; and singulating said plurality of semiconductor devices by separation thereof in said street areas.

2. The method of claim 1, further comprising flattening said exterior surface of said first plate of glass in correlation with said second side of said semiconductor wafer substrate after reducing said thickness of said semiconductor wafer substrate.

3. The method of claim 1, wherein said first plate of glass comprises a photo-etchable material.

4. The method of claim 1, wherein removing said portion of said second side includes planarizing said second side of said semiconductor wafer substrate to be substantially parallel with said exterior surface of said first plate of glass.

5. The method of claim 1, wherein reducing said thickness of said semiconductor wafer substrate by removing said portion of said second side thereof comprises reducing said thickness of said semiconductor wafer substrate using one of a chemical etching process, a mechanical polishing process and a mechanical polishing process using a chemical etchant abrasive slurry.

6. The method of claim 1, wherein separating said plurality of semiconductor devices comprises one process of an etching process through said semiconductor wafer substrate in said street areas and a mechanical scribing process through said semiconductor wafer substrate.

7. The method of claim 1, wherein applying said sealant material to said second side of said semiconductor wafer substrate comprises attaching a second plate of glass to said second side of said semiconductor wafer substrate using a sealant adhesive.

8. The method of claim 1, wherein applying said sealant material to said second side of said semiconductor wafer substrate comprises application of a polymeric sealant thereto.

9. The method of claim 1, wherein forming said array of contact holes comprises forming substantially linear holes through said first plate of glass in an array substantially identical to said plurality of bond pads by one of a photo-etching process and a mechanical drilling process.

10. The method of claim 1, wherein depositing said metal comprises applying said metal to said exterior surface of said first plate of glass including said array of contact holes and etching said metal to provide separate interconnects and leads passing through said array of contact holes to connect said interconnects with said plurality of bond pads.

11. The method of claim 1, wherein depositing said metal comprises application of one of tungsten, aluminum or copper, or alloys thereof.

12. The method of claim 1, wherein depositing said metal comprises applying one of palladium or an alloy thereof.

13. The method of claim 1, further comprising applying an insulative sealant coating over said exterior surface of said first plate of glass.

14. The method of claim 13, wherein said insulative sealant coating comprises silicon nitride.

15. A manufacturing method for a semiconductor device using a semiconductor wafer substrate having a first side and a second side, a plurality of semiconductor devices formed on said semiconductor wafer substrate having street areas therebetween, each semiconductor device of said plurality of semiconductor devices having at least one circuit formed therein and a plurality of bond pads on a first side thereof, at least one bond pad of said plurality of bond pads connected to said at least one circuit, said method comprising:

adhesively securing a first plate of glass to said first side of said semiconductor wafer substrate, said first plate of glass having an exterior surface and a substantially parallel interior surface;

planarizing said exterior surface of said first plate of glass in correlation with said second side of said semiconductor wafer substrate after adhesively securing said first plate of glass to said first side of said semiconductor wafer substrate with adhesive;

reducing a thickness of said semiconductor wafer substrate by removing a portion of said second side thereof;

separating said plurality of semiconductor devices by removing substrate material in said street areas, said plurality of semiconductor devices remaining adhesively secured to said first plate of glass;

applying a sealant material to said second side of said semiconductor wafer substrate;

forming an array of contact holes extending through said first plate of glass to said plurality of bond pads;

metallizing said exterior surface of said first plate of glass to form a pattern of conductive leads for connecting said plurality of bond pads to said metallized exterior surface of said first plate of glass;

singulating said plurality of semiconductor devices by separation thereof in said street areas; and flattening said exterior surface of said first plate of glass in correlation with said second side of said semiconductor wafer substrate after reducing said thickness of said semiconductor wafer substrate.

16. The method of claim 15, wherein reducing said thickness includes planarizing said second side of said semiconductor wafer substrate to be substantially parallel with said exterior surface of said first plate of glass.

17. The method of claim 15, wherein reducing said thickness of said semiconductor wafer substrate by removing said portion of said second side thereof comprises reducing said thickness of said semiconductor wafer substrate using one of a chemical etching process, a mechanical polishing process and a mechanical polishing process using a chemical etchant abrasive slurry.

18. The method of claim 15, wherein separating said plurality of semiconductor devices comprises one process of an etching process through said semiconductor wafer substrate in said street areas and a mechanical scribing process through said semiconductor wafer substrate.

19. The method of claim 15, wherein applying said sealant material to said second side of said semiconductor wafer substrate comprises attaching a second plate of glass to said second side of said semiconductor wafer substrate using one of a sealant adhesive and a polymeric sealant applied thereto.

20. The method of claim 15, wherein forming said array of contact holes comprises forming substantially linear holes through said first plate of glass in an array substantially identical to said plurality of bond pads by one of a photo-etching process and a mechanical drilling process.

* * * * *

UNITED STATES PATENT AND TRADEMARK OFFICE
CERTIFICATE OF CORRECTION

PATENT NO. : 6,787,394 B2  Page 1 of 1
APPLICATION NO. : 10/357656
DATED : September 7, 2004
INVENTOR(S) : Warren M. Farnworth It is certified that error appears in the above-identified patent and that said Letters Patent is hereby corrected as shown below:

On the title page:
In ITEM (56) "References Cited,
   $2^{nd}$ COLUMN, after last entry of
   U.S. Patent Documents, before
   "* cited by examiner" insert    --Other Publications--
--Wolf et al., "Silicon Processing for the VLSI Era," Volume 1: Process Technology, 1986, pp. 399-406.--

Signed and Sealed this

Twenty-eighth Day of August, 2007

JON W. DUDAS
*Director of the United States Patent and Trademark Office*